(12) United States Patent
Sugino et al.

(10) Patent No.: US 6,566,040 B1
(45) Date of Patent: May 20, 2003

(54) METHOD OF MANUFACTURING A SEMICONDUCTOR DEVICE AND SEMICONDUCTOR DEVICE MANUFACTURED BY THE METHOD

(75) Inventors: Kanji Sugino, Tokyo (JP); Takeo Ishibashi, Tokyo (JP); Takayuki Shoya, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 09/233,217

(22) Filed: Jan. 20, 1999

(30) Foreign Application Priority Data

Aug. 6, 1998 (JP) .......................................... 10-223278

(51) Int. Cl.⁷ .............................. G03C 5/56; G03C 5/18
(52) U.S. Cl. ...................... 430/313; 430/312; 430/328; 430/330; 430/270.1; 430/170; 430/189; 430/141; 134/1.3
(58) Field of Search ................................ 430/312, 313, 430/330, 328, 270.1, 141, 170, 189; 134/1.3

(56) References Cited

U.S. PATENT DOCUMENTS

| 4,501,806 A | | 2/1985 | Watanabe et al. ............. 430/25 |
| 5,324,550 A | | 6/1994 | Yamaguchi et al. ........ 427/510 |
| 5,342,727 A | | 8/1994 | Vicari et al. ................ 430/157 |
| 5,527,662 A | * | 6/1996 | Hashimoto et al. ...... 430/270.1 |
| 5,545,512 A | | 8/1996 | Nakato ........................ 430/323 |
| 5,858,620 A | * | 1/1999 | Ishibashi et al. ............ 430/313 |
| 6,180,320 B1 | * | 1/2001 | Saito et al. ................ 430/311 |

FOREIGN PATENT DOCUMENTS

| JP | 5-160019 | 6/1993 |
| JP | 5-166717 | 7/1993 |
| JP | 5-241348 | 9/1993 |
| JP | 6-104171 | 4/1994 |
| JP | 6-250379 | 9/1994 |
| JP | 7106237 | 4/1995 |
| JP | 7-134422 | 5/1995 |
| JP | 10-73927 | 3/1998 |
| KR | 98-5636 | 3/1998 |

OTHER PUBLICATIONS

"Electron–Beam, X–Ray, and Ion–Beam Technology: Submicrometer Lighographies VII" by Arnold W. Yanof, Proceedings of SPIE—The International Society for Optical Engineering, Mar. 2–4, 1988, vol. 923, pp. 158–171.

"Deep UV ANR Photoresists for 248 nm Excimer Laser Photolighography" by James Thockeray, et al., Proceedings of SPIE—The International Society for Optical Engineering, 1989, vol. 1086, pp. 34–47.

* cited by examiner

*Primary Examiner*—Mark F. Huff
*Assistant Examiner*—Daborah Chacko-Davis
(74) *Attorney, Agent, or Firm*—McDermott, Will & Emery

(57) ABSTRACT

First, a hole pattern or a separation pattern of a first resist that is capable of supplying acid is formed on a semiconductor substrate. Then, a crosslinked film (organic frame) is formed on the side wall of the first resist pattern to obtain a resist pattern having a reduced hole diameter or separation width. Then, the hole diameter or the separation width is further reduced by causing thermal reflow of the crosslinked film. Finally, the semiconductor substrate is etched by using a resulting resist pattern as a mask.

17 Claims, 8 Drawing Sheets step 1 step 2 step 3 step 4 step 5 inter-gate gap
0.30 μm step 1 1 step 1 2 reduction of separation gap step 1 3

METHOD OF MANUFACTURING A SEMICONDUCTOR DEVICE AND SEMICONDUCTOR DEVICE MANUFACTURED BY THE METHOD

BACKGROUND OF THE INVENTION

1. Field of the Invention

The present invention relates to a method of manufacturing a semiconductor device having a hyperfine pattern beyond the limit of the lithography technology, and to a semiconductor device manufactured by the manufacturing method.

2. Background Art

The present inventors proposed a method of forming a fine resist pattern that is beyond the limit of the exposure-based photolithography technology (for instance, U.S. patent application Ser. No. 08/785,846 filed on Jan. 24, 1997, or Japanese Patent Application Laid-Open No. 10-73927). FIG. 10 outlines this method. In this method, in step 11 shown in FIG. 10, a first resist pattern 3 capable of supplying acid is formed on a semiconductor substrate 1 and then a second resist in which a crosslinking reaction is caused by acid is applied to the pattern 3 including the surface of a hole 4. In step 12, a crosslinked film (organic frame) 7 is formed on the side wall of the first resist pattern 3 by a heat treatment and resulting dissolution. In this manner, the inner diameter of the hole 8 or the separation width of a line pattern is reduced.

In the above method, the thickness of the crosslinked film (organic frame) 7 can be controlled by adjusting the temperature or time of the heat treatments (mixing baking) of the first and second resists or the material composition of the second resist. However, where the hole inner diameter or the separation width of a line pattern is made extremely small, there may occur an event that residues 10 or the like of the second resist remain in the hole 8 and other portions (shown as step 13), and will obstruct satisfactory pattern formation.

Where the hole inner diameter is further reduced to 0.1 $\mu m\square$ (a square each side of which is 0.1 $\mu m$ long) or less, there may occur an event that residues remain in the hole 8 or the interface portion with the semiconductor substrate 1 in the hole 8 at the time of cleaning and drying of a second resist rinse-removal step and will cause etching defects. This is another problem of the conventional method.

SUMMARY OF THE INVENTION

An object of the present invention is to solve the above problems and thereby provide a method of manufacturing a semiconductor device which can make the diameter of a resist hole pattern or the separation width of a resist line pattern extremely small, as well as a semiconductor device that is manufactured by such a manufacturing method. Such a hyperfine pattern is applicable to manufacture of LSI semiconductor devices, liquid crystal display panels, etc.

According to one aspect of the present invention, in a method of manufacturing a semiconductor device, a first resist pattern of a first resist, that is capable of generating acid, is formed on a semiconductor base member. A film of a second resist is formed on the first resist pattern, and the second resist is such that a crosslinking reaction occurs therein under presence of acid. A crosslinked film is formed in a portion of the film of the second resist that is in contact with the first resist pattern by causing the first resist pattern to supply acid to the film of the second resist. A second resist pattern is formed in which the first resist pattern is covered with the crosslinked film by removing an uncrosslinked portion of the film of the second resist. A heat treatment is performed to cause thermal reflow of the crosslinked film, to thereby reduce a gap in the second resist pattern. Further, the semiconductor base member is etched by using, as a mask, the second resist pattern having the reflow-subjected crosslinked film.

In another aspect of the present invention, in the manufacturing method, between the heat treatment and the etching, the second resist pattern may be cleaned with pure water or a mixed solvent of pure water and an organic solvent, to remove a residue in a portion that is not in contact with the first resist pattern.

In another aspect of the present invention, in the method of manufacturing a semiconductor device, a heat treatment may be performed, after forming the second resist pattern including the crosslinked film, to render the crosslinked film insoluble in pure water or a mixed solvent of pure water and an organic solvent. Further, cleaning the second resist pattern may be cleaned with pure water or the mixed solvent of pure water and the organic solvent, to thereby remove a residue in a portion that is not in contact with the first resist pattern. Thereafter, the semiconductor base member may be etched by using the residue-removed second resist pattern as a mask.

Other and further objects, features and advantages of the invention will appear more fully from the following description.

DETAILED DESCRIPTION OF THE PREFERRED EMBODIMENT

Figure 1:
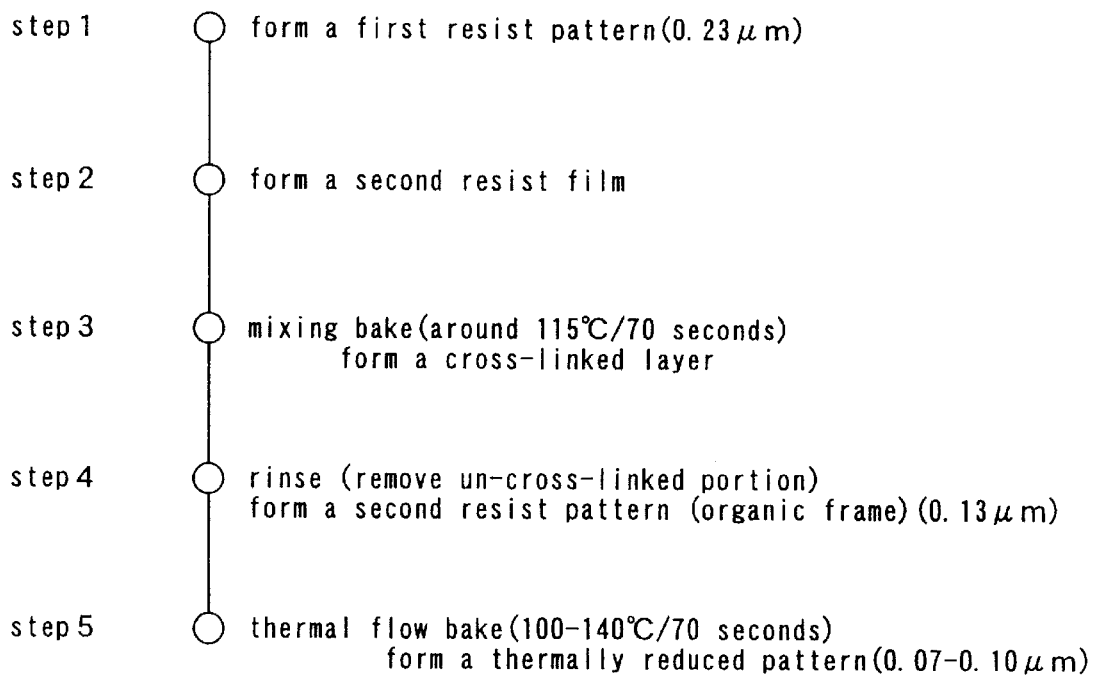
FIG. 1 shows a process flow of a method of manufacturing a semiconductor device according to a first embodiment of the present invention.

This invention will be described in further detail by way of examples with reference to the accompanying drawings, in which the same reference numerals designate the same or corresponding portions.

First Embodiment

A first embodiment of the present invention will be hereinafter described with reference to FIGS. 1 through 8.

Figure 2:
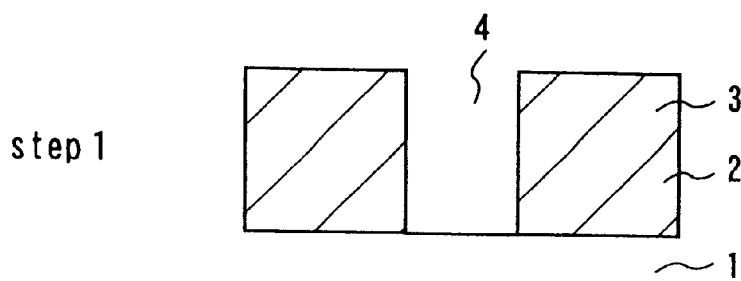
FIG. 2 shows, in the form of sectional views, the manufacturing method according to the first embodiment in accordance with the process flow.
Figure 2:
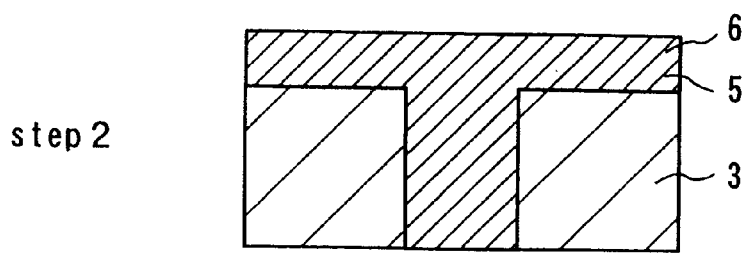
Figure 2:
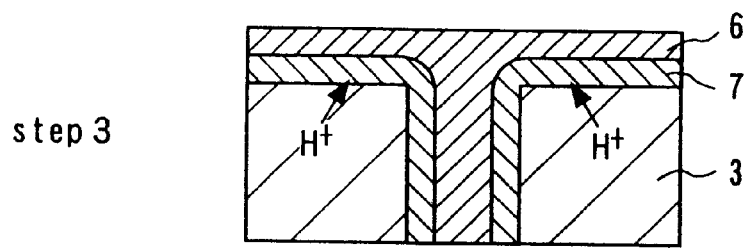
Figure 2:
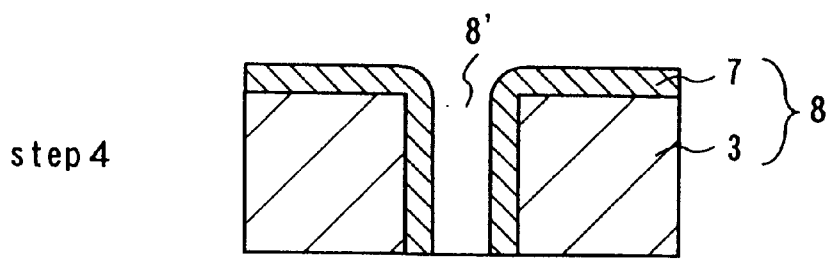
Figure 2:
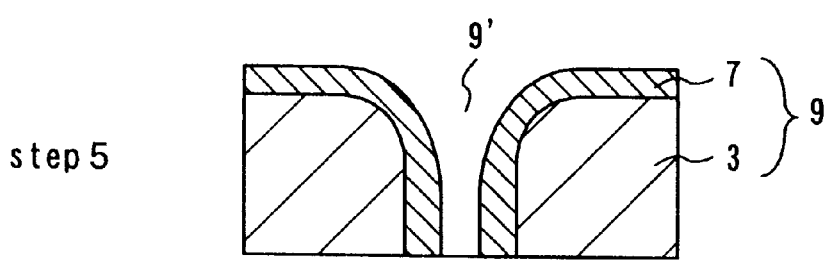

FIG. 1 shows a flow of a method of manufacturing a semiconductor device according to the first embodiment. FIG. 2 shows, in the form of sectional views, the manufacturing method according to the first embodiment in accordance with the process flow. First, the manufacturing method will be described step by step.

First, in step 1 shown in FIGS. 1 and 2, a first resist 2 having internally a mechanism capable of supplying acid when subjected to a proper heat treatment is applied to a semiconductor substrate 1 at a thickness of about 0.7–1.0 $\mu$m, for example. To give a specific example, a chemical amplification resist (e.g., TDUR-P015PM of Tokyo Ohka Kogyo Co., Ltd) is applied at a thickness of 7,350 Å.

Then, to form a first resist pattern 3, projection exposure is performed by using a predetermined mask and a light source that corresponds to a sensitive wavelength of the first resist 2. For example, exposure is performed by using a KrF excimer stepper.

Then, development is performed by using an alkali aqueous solution containing TMAH (tetramethylammonium hydroxide) or the like at about 0.05–3.0 wt %. As a result, a first resist pattern 3 having a hole 4 of 0.23 $\mu$m□ is formed.

The above step is the same as a step of forming a resist pattern by a general resist process except for the use of the first resist 2 that generates acid.

Then, in step 2 shown in FIGS. 1 and 2, a second resist 5 that is mainly made of a crosslinking material (that crosslinks under presence of acid) and is dissolved in a solvent that does not dissolves the first resist 2 is applied to the first resist pattern 3. To give a specific example, an aqueous solution of polyvinyl acetal resin as the second resist 5 is applied to the first resist pattern 3 at a thickness of about 3,500 Å.

Then, if necessary, the second resist 5 is prebaked (e.g., at 85° for about 60 seconds). A film 6 of the second resist 5 is thus formed.

Then, in step 3 shown in FIG. 1 and 2, the first resist pattern 3 formed on the semiconductor substrate 1 and the film 6 of the second resist 5 formed on the first resist pattern 3 are subjected to a heat treatment (mixing baking; hereinafter abbreviated as MB if necessary). As a result, the diffusion of acid from the first resist pattern 3 into the film 6 of the second resist 5 is accelerated, whereby a crosslinking reaction occurs at the interface between the first resist pattern 3 and the film 6 of the second resist 5.

The mixing baking temperature and time may be set at optimum values in accordance with the kinds of resist materials used and a necessary thickness of the reaction layer in respective ranges of 85°–150° C. and 60–120 seconds, for example. To give a specific example, a heat treatment (mixing baking) is performed at 113° C. for 70 seconds.

As a result of the mixing baking, a crosslinked film (crosslinking reaction layer, organic frame) 7 where the crosslinking reaction has occurred is formed inside the film 6 of the second resist 5 so as to cover the first resist pattern 3.

Then, in step 4 shown in FIGS. 1 and 2, the uncrosslinked portion of the second resist 5 is developed and peeled off by using water, an alkali aqueous solution of TMAH or the like, or some other developer, whereby a second resist pattern 8 is formed in which the first resist pattern 3 is covered with the crosslinked film 7. To give a specific example, the uncrosslinked portion of the second resist 5 is dissolved and peeled off with a 10% aqueous solution of isopropyl alcohol As a result of the above steps, the second resist pattern 8 can be obtained in which the hole inner diameter of a hole pattern or the separation width of a line pattern is reduced or the area of an isolated remaining pattern is increased. For example, the hole 4 having a hole diameter 0.23 $\mu$m□ is reduced to a hole 8' having a hole diameter 0.13 $\mu$m□.

Then, in step 5 shown in FIGS. 1 and 2, a heat treatment (thermal flow baking; hereinafter abbreviated as TFB if necessary) is performed to cause thermal reflow of the crosslinked film 7 that is attached to the first resist pattern 3, whereby the second resist pattern 8 is deformed into a second resist pattern 9, and the hole 8' is reduced to a hole 9'(hole diameter is reduced).

The degree of hole diameter reduction can be adjusted by the heating temperature and time of the TFB. In this manner, the hole diameter can be reduced to 0.1 $\mu$m less.

Figure 3:
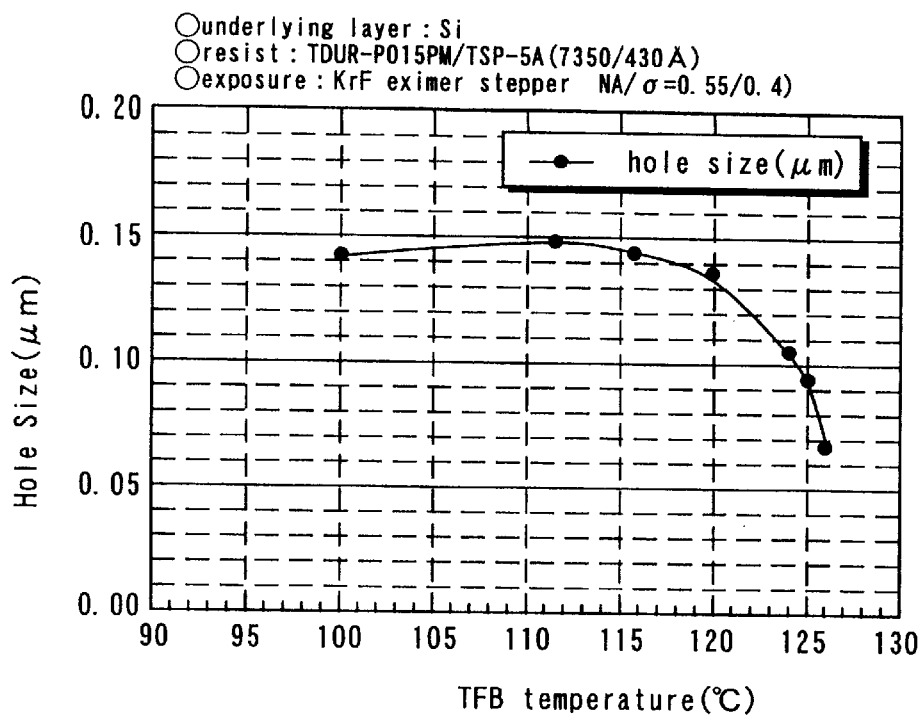
FIGS. 3 and 4 show characteristics of a heat treatment that is performed in the first embodiment, specifically relationships between the hole diameter and the heating temperature and time, respectively.
Figure 4:
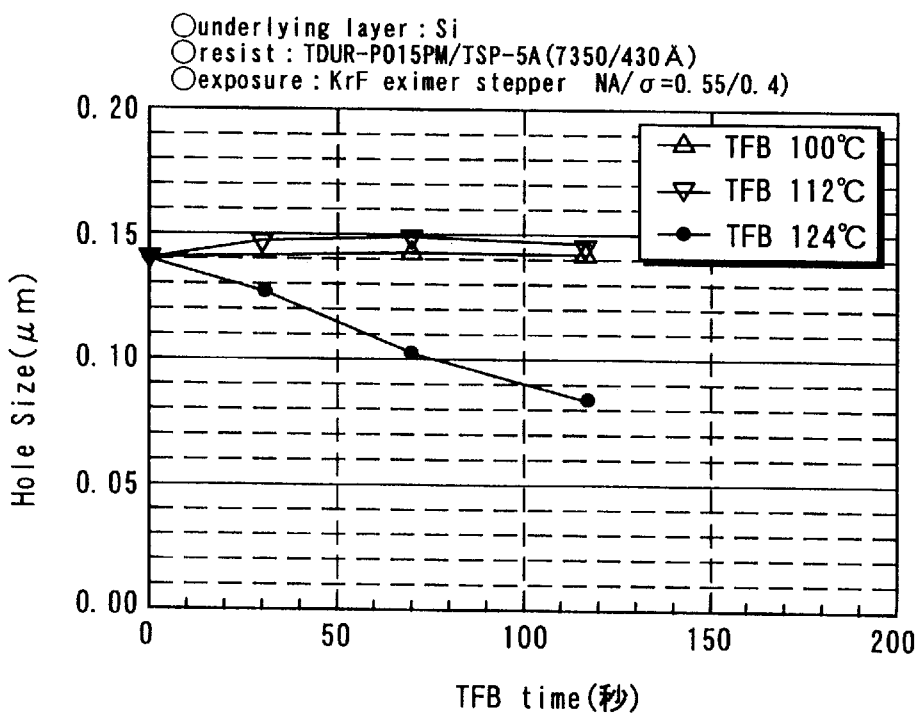

FIGS. 3 and 4 are graphs based on experimental data showing relationships between the hole diameter and the heating temperature and time, respectively.

FIG. 3, in which the heating time is fixed (at 70 seconds, for example) and the horizontal axis and the vertical axis represent the heating temperature and the hole diameter, respectively, shows how the hole diameter decreases. As seen from FIG. 3, the hole reduction is remarkable in a temperature range higher than 120° C.

FIG. 4, in which the heating temperature is a parameter (specifically, 100° C., 112° C., and 124° C.) and the horizontal axis and the vertical axis represent the heating time and the hole diameter, respectively, shows how the hole diameter decreases. As seen from FIG. 4, when the heat temperature is 124° C., the hole diameter decreases approximately in proportion to the heating time.

This experiment shows that the TFB can cause hole reduction in a temperature range of 120–126° C. and a time range of 50–150 seconds, and that it is effective to perform TFB in a temperature range of 123–125° C. and a time range of 50–100 seconds.

As described above, the amount of hole diameter reduction or line interval reduction by the TFB can be adjusted by the TFB temperature and time. To give a specific example, it is efficient to fix the TFB time at 70 seconds in view of the processing ability in mass-production and to set the TFB temperature at 124° C. for that baking time to obtain a hole diameter of 0.10 $\mu$m.

As described above, by causing thermal reflow of the cross-linked film 7, the hole diameter can further be reduced, that is, in addition to the reduction due to the formation of the crosslinked film 7. In particular, this enables formation of a hyperfine hole of such a level that because of resist residues and the like in a hole, the hole diameter reduction by only the formation of a crosslinked film is insufficient for satisfactory pattern formation.

The optimum TFB temperature and time depend on the materials of the first and second resists, and should be set properly in accordance with those materials.

The material for the first resist 2 may be ones which make use of a mechanism capable of generating an acidic component inside the resist by an appropriate thermal treatment, and may be of the positive or negative type.

For instance, as the first resist, mention is made of a positive resist constituted of novolac resin and a naphthoquinonediazide photosensitive agent.

Moreover, a chemically amplified resist making use of an acid generating mechanism may also be used as the first resist. Other types of resist materials may also be used so far as they utilize reaction systems of generating an acid by application of heat.

The material for the second resist 5 is described.

The second resist may be made of a crosslinkable water-soluble resin alone or a mixture of these resins or a copolymer composed of two or more kinds of water soluble-resins.

Where a mixture is used as the second resist, its optimal composition should be determined depending on the type of first resist material and preset reaction conditions, and is not limited to any specific one.

Alternatively, as a second resist, a water-soluble crosslinking agent alone or a mixture of these agents may also be used. Further, mixtures of the water-soluble resins and water-soluble crosslinking agents may be used.

The water-soluble crosslinking agents used as the second resist include urea crosslinking agents such as urea, alkoxymethyleneureas, N-alkoxymethylene ureas, ethyleneurea, ethylene urea carboxylates and the like, melamine crosslinking agents such as melamine, alkoxymethylene melamines and the like, and amino crosslinking agents such as benzoguanamine, glycoluril and the like.

Moreover, examples of water-soluble resist materials usable as the second resist include, aside from the water-soluble resins used singly or in combination and water-soluble crosslinking agents used singly or in combination, the mixtures of these resins and crosslinking agents.

For instance, mention is particularly made of a mixture of a polyvinyl acetal resin as the water-soluble resin and methoxymethylolmelamine or ethyleneurea as the water-soluble crosslinking agent. In this case, because of the high solubility in water, the solution of the mixture exhibits good storage stability.

It will be noted that the material applied to as the second resist is not critical provided that it is soluble in water or soluble in a water-soluble solvent incapable of dissolving the first resist pattern and undergoes crosslinking reaction in the presence of an acidic component.

In the above description, the typical examples were described for steps 1 through 4 of the manufacturing process shown in FIGS. 1 and 2 and the materials of the first and second resists. However, this embodiment is not limited to those examples, and the contents disclosed in a previous patent application of the inventors (Japanese Patent Application Laid-Open No. 10-73927) can be applied as other examples where appropriate. Duplicate description of those examples here is refrained from.

Next, a description will be made of a method for improving the uniformity of thermal reflow of the crosslinked film 7.

Figure 5:
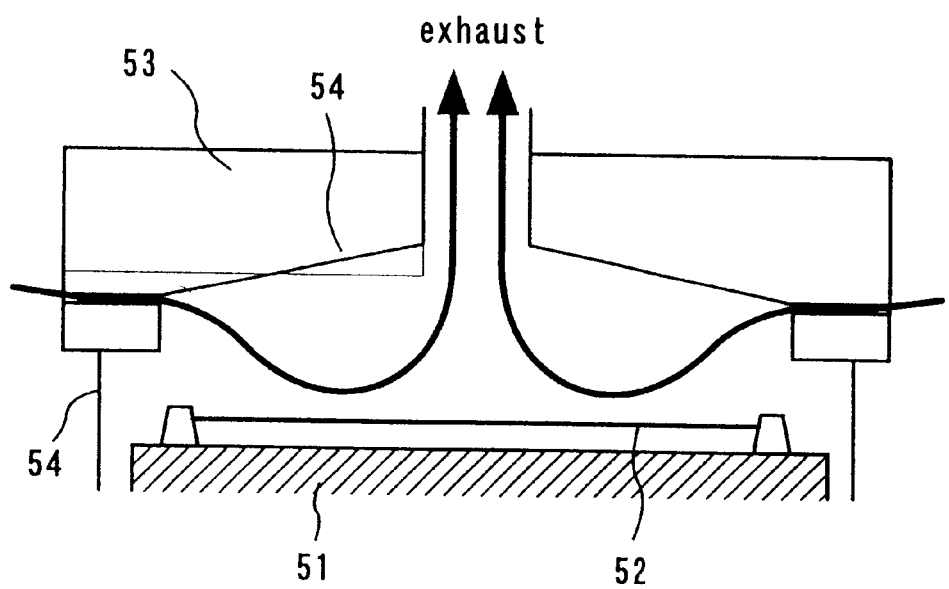
FIG. 5 is a schematic sectional view of an ordinary hot plate apparatus for comparison.
Figure 6:
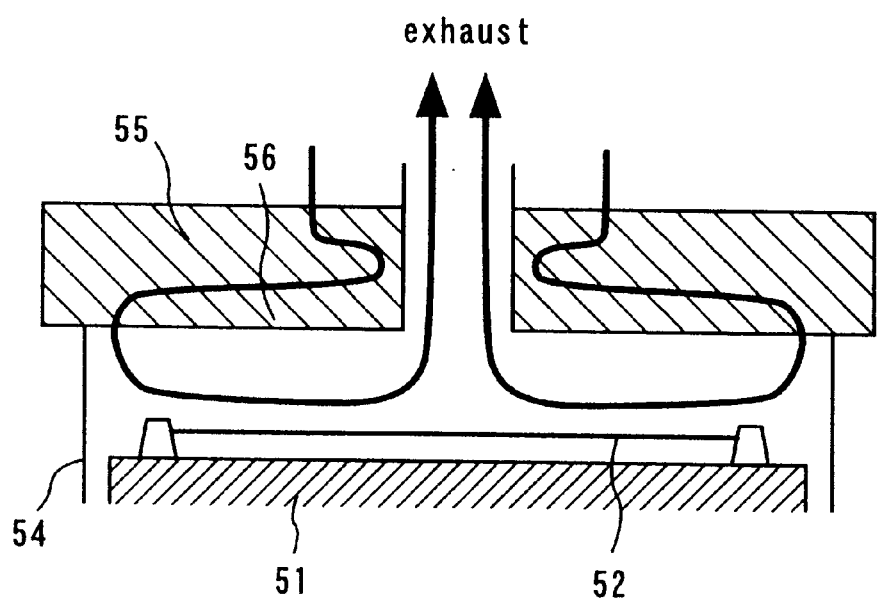
FIG. 6 is a schematic sectional view of an improved hot plate apparatus that is suitable for use in the first embodiment.

FIGS. 5 and 6 show hot plate apparatuses for causing thermal reflow. Specifically, FIG. 5 is a schematic sectional view of an ordinary hot plate apparatus for comparison, and FIG. 6 is a schematic sectional view of an improved hot plate apparatus that is suitable for use in this embodiment. The improved hot plate apparatus is described in detail in a previous patent application of the present inventors (Japanese Patent Application No. 9-332584) as being a coater developer that uses an improved hot plate cover and improves the uniformity of dimensions in a wafer surface that relates to thermal reflow.

In the ordinary hot plate apparatus shown in FIG. 5, a wafer 52 is placed on a baking plate 51 and external air is directly introduced through the gap between a cover 53 and a shutter 54. Therefore, being influenced by the external air, the temperature profile in the surface of the wafer 52 tends to be non-uniform. Further, an inclination of a top plate 54 of the cover 53 makes the heat radiation profile less uniform.

In view of the above, in the improved hot plate apparatus shown in FIG. 6, external air is introduced after being passed through the inside of a cover 55, whereby the influence of the external air temperature is avoided. Further, a top plate 56 of the cover 55 is made flat to uniformize the heat radiation profile.

Figure 7:
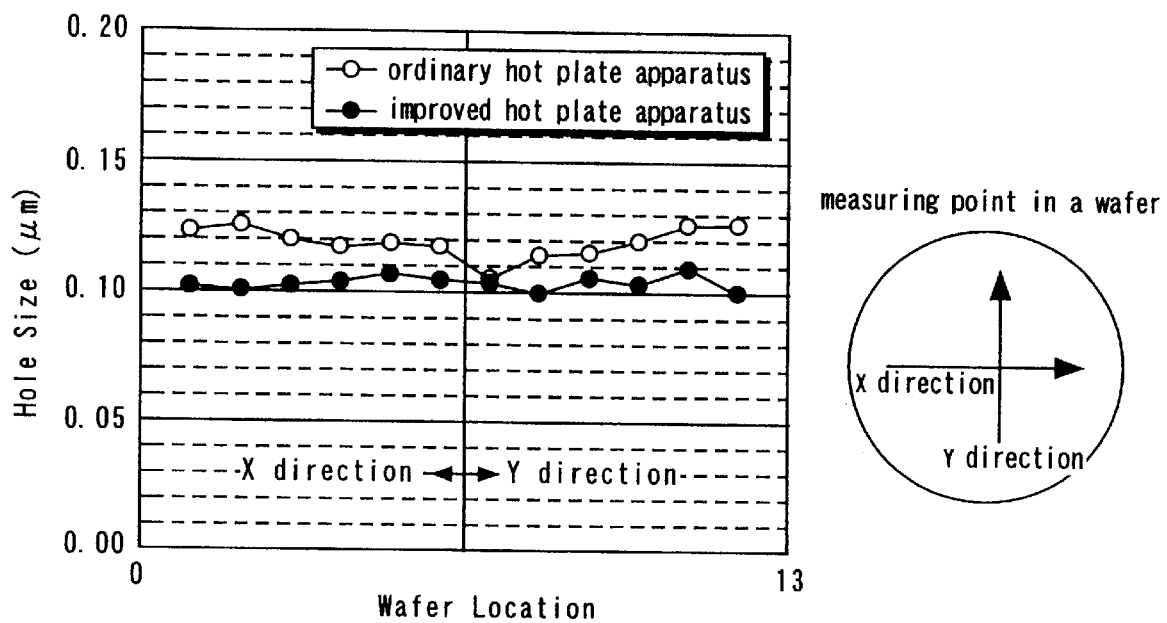
FIG. 7 is a graph showing the uniformity of dimensions in a wafer surface in cases where the ordinary hot plate apparatus and the improved hot plate apparatus were used.

FIG. 7 is a graph showing the uniformity of dimensions in a wafer surface in cases where the ordinary hot plate apparatus and the improved hot plate apparatus were used. In FIG. 7, the horizontal axis represents the position in each of the horizontal direction (X-direction) and the vertical direction (Y-direction) in a wafer surface and the vertical axis represents the hole diameter. A curve with white circles corresponds to a case where the ordinary hot plate apparatus was used, and a curve with black circles corresponds to a case where the improved hot plate apparatus was used. As seen from FIG. 7, the curve of the ordinary hot plate apparatus has a clear hole diameter variation in the wafer surface, whereas the curve of the improved hot plate apparatus is approximately uniform. This indicates that the improved hot plate apparatus decreases the variation range ($3\sigma$) of dimensions.

Figure 8:
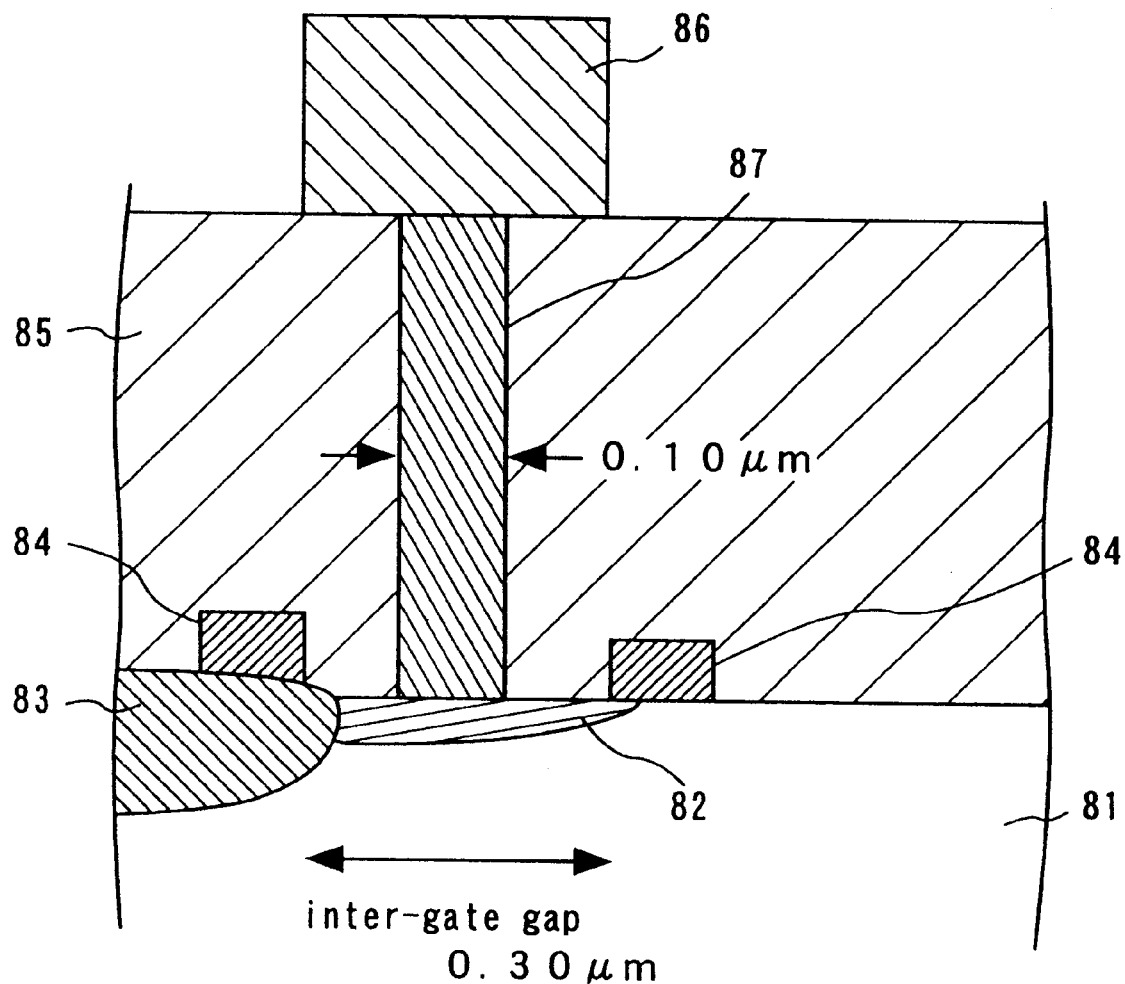
FIG. 8 is a sectional view of the structure of an example semiconductor device manufactured by the manufacturing method according to the first embodiment.

FIG. 8 is a sectional view of a structure of an example semiconductor device manufactured by the manufacturing method according to the first embodiment. In this example, the hole diameter of a storage node contact hole of a DRAM as a semiconductor memory is reduced.

In FIG. 8, reference numeral 81 denotes a semiconductor substrate; 82, an active region; 83, an isolation insulating film; 84, a gate electrode and gate lead; 85, an interlayer insulating film; 86, a storage node; and 87, a storage node contact.

As shown in FIG. 8, where the interval between adjacent gates 84 is 0.30 $\mu$m for instance, the hole for the storage node contact 87 should have a diameter as small as 0.10 $\mu$m in view of variation of dimensions, overlay errors, and the thickness of the interlayer insulating film 85. Therefore, in this example, a hole having a diameter 0.23 $\mu$m□ which is the limit value of a photolithography process using KrF excimer laser light is reduced to have a diameter 0.10 $\mu$m□.

In this manner, according to the manufacturing method of this embodiment, since the hole inner diameter or the separation width of a resist film can be reduced, the diameter of a contact hole or the separation width of active regions or storage nodes in a semiconductor device can be reduced. Further, by controlling the degree of reduction of the hole diameter or the separation width, the accuracy of a hyperfine resist pattern can be increased.

As described above, according to this embodiment, after a crosslinked film (organic frame) of a second resist is formed on the surface of a first resist pattern, a heat treatment is performed to cause thermal reflow of the crosslinked film. This process makes it possible to form a resist pattern having a hole or the like that is so small as not to be obtained by size reduction using only a crosslinking reaction, and hence enables manufacture of a semiconductor device having a hyperfine pattern.

The first embodiment may be summarized as follows. The method of manufacturing a semiconductor device according to the first embodiment comprises the steps of forming, on a semiconductor substrate or the like, a hole pattern or a separation pattern of a first resist that is capable of supplying acid; forming a crosslinked film (organic frame) on the side wall of the first resist pattern by using the method described in the Japanese Patent Application Laid-Open No. 10-73927 to obtain a resist pattern having a reduced hole diameter, separation width, or the like; further reducing the hole diameter, the separation width, or the like by causing thermal reflow of the crosslinked film; and etching the semiconductor substrate or the like by using a resulting resist pattern as a mask.

Second Embodiment

Figure 9:
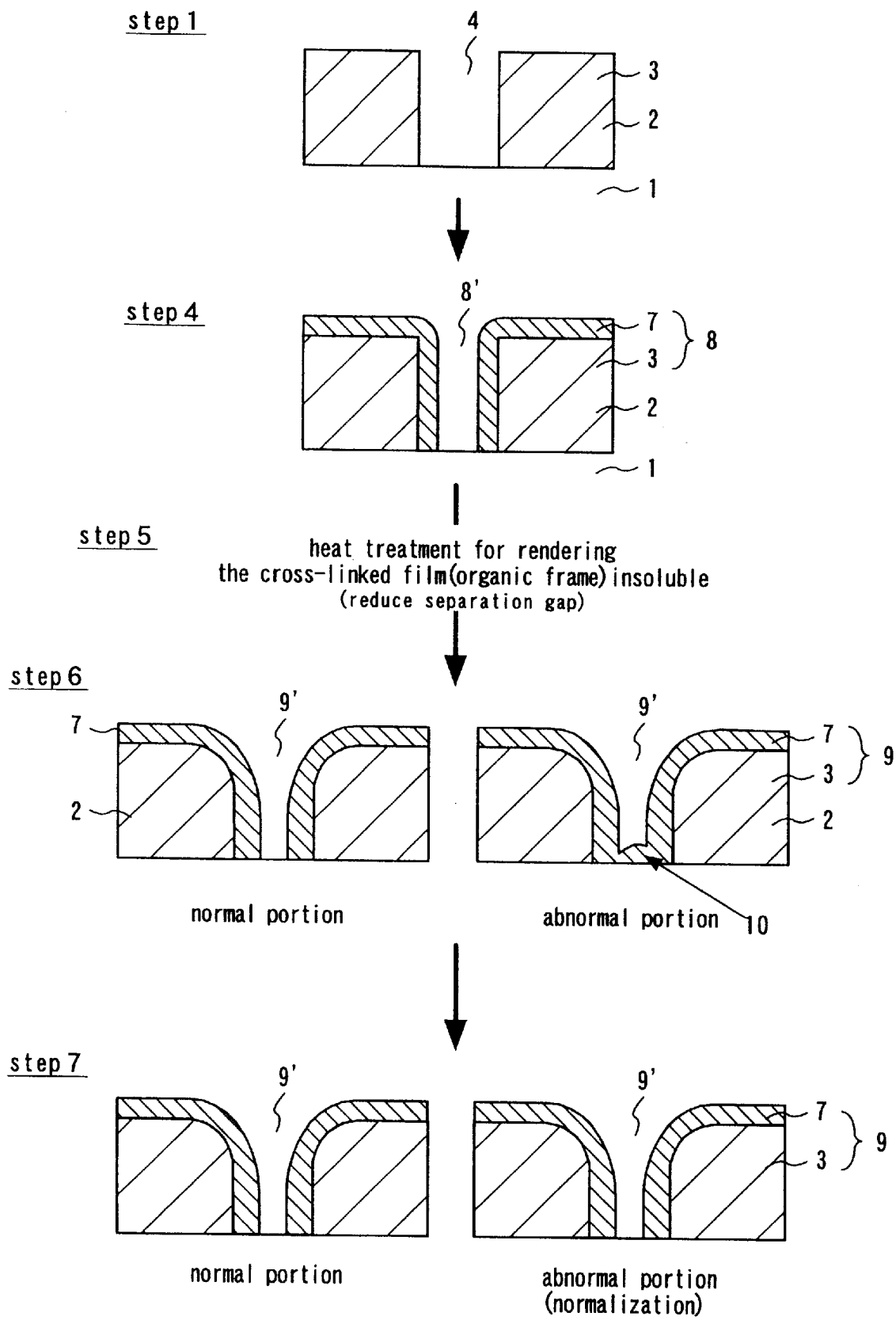
FIG. 9 shows a flow of a method of manufacturing a semiconductor device according to a second embodiment of the invention.
Figure 10:
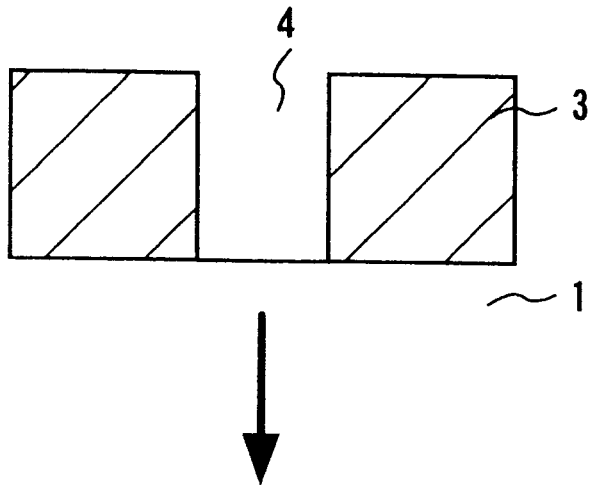
FIG. 10 shows, in the form of sectional views, a conventional method of manufacturing a semiconductor device in accordance with a process flow.
Figure 10:
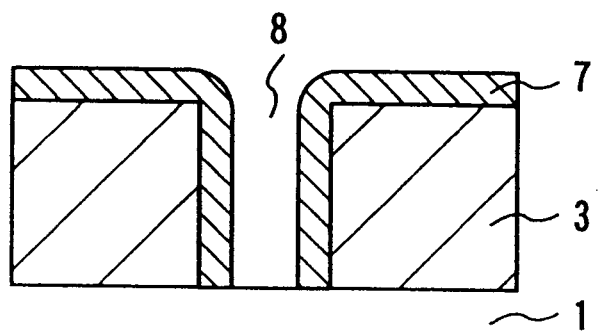
Figure 10:
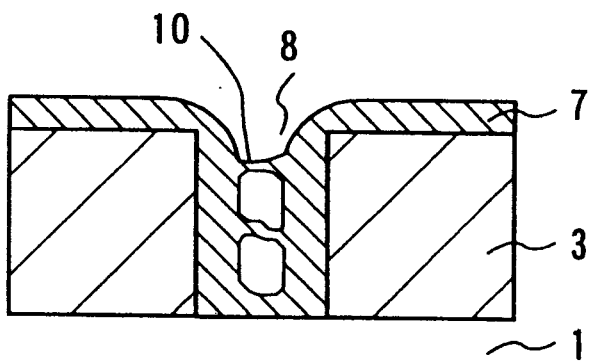

FIG. 9 shows a flow of a method of manufacturing a semiconductor device according to a second embodiment of the present invention.

Since steps 1 through 4 shown in FIG. 9 are the same as those shown in FIGS. 1 and 2, their illustration is partially omitted and descriptions therefor will be omitted. In step 4, a second resist pattern 8 is formed in which a first resist pattern 3 is covered with a crosslinked film 7.

Then, in step 5, a heat treatment for rendering the crosslinked film (organic frame) 7 insoluble is performed. In this step 5, a sufficient heat treatment is performed to render only the portion of the crosslinked film 7 that is contact with the first resist pattern 3 completely insoluble at the thermal flow baking temperature or a temperature that does not cause hole diameter reduction due to thermal reflow but at least higher than the mixing baking temperature. For example, the heat treatment is performed in a temperature range of 115°–140° and in a time range of 50–150 seconds.

In step 5 shown in FIG. 9, thermal reflow of the crosslinked film 7 is actually caused, whereby a hole 8' is reduced in diameter to a hole 9' and the second resist pattern 8 is deformed into a second resist pattern 9.

Then, in step 6 shown in FIG. 9, to remove residues 10 that exist on the interface portion with the semiconductor substrate 1 and are not in contact with the first resist pattern 3, rinsing is again performed with pure water or an aqueous solution in which isopropyl alcohol is dissolved in pure water at 10%. As a result, the residues 10 existing in a minute hole or the like are removed as shown in step 7 of FIG. 9.

After step 7, a baking step for drying may be executed at 100°–115° C. for 60–120 seconds to remove residual water.

Before the re-rinsing of step 6, very small amounts of dissolved substances may re-precipitate at the time of drying of the preceding cleaning step, and there may be fine holes where residues of 10–20 nm in size remain, though the probability is very low. This may cause an event that in a subsequent etching step for etching, for example, a structure whose very surface is a nitride film (~30 nm), an intended opening is not formed completely because the residues of 10–20 nm in size serve as a mask (this phenomenon depends on the resist selective etching ratio).

Even when such residues exist, the probability that the residues cause a problem can be reduced greatly by the above-described steps, that is, the heat treatment for rendering the crosslinked film 7 insoluble and the removal of the residues.

As described above, according to this embodiment, the portion of the crosslinked film (organic crosslinked layer) 7 that is in contact with the first resist pattern 3 is rendered completely insoluble in pure water or a mixed solvent of pure water and an organic solvent in causing thermal reflow of the crosslinked film 7. Then, residues that are not in contact with the first resist pattern 3 are rinsed and removed with pure water or the mixed solvent of pure water and the organic solvent. A state that residues remain can thus be eliminated.

The above second embodiment may be summarized as follows. The method of manufacturing a semiconductor device according to the second embodiment comprises the steps of forming, on a semiconductor substrate or the like, a hole pattern or a separation pattern of a first resist that is capable of supplying acid; reducing the hole diameter or the separation width by forming a crosslinked film (organic frame) on the side wall of the first resist pattern by using the method as described in U.S. patent application Ser. No. 08/785,846 (Japanese Patent Application Laid-Open No. 10-73927); rendering the portion of the crosslinked film that is in contact with the first resist pattern completely insoluble in pure water or a mixed solvent of pure water and an organic solvent by performing a heat treatment at a temperature at least higher than the mixing baking temperature or by performing a heat treatment for substantially long time; again rinsing a resulting pattern with pure water or the mixed solvent of pure water and the organic solvent, to thereby remove left residues except the portion in contact with the first resist pattern; and etching the semiconductor substrate or the like by using a resulting resist pattern as a mask.

The second embodiment encompasses a case where the step of performing the heat treatment for rendering the crosslinked film insoluble has also a function of further reducing the hole diameter or the separation width by causing thermal reflow of the crosslinked film.

The second embodiment has been described above as making a transition to step 5 after execution of step 4 of the first embodiment shown in FIG. 1. However, a transition to step 5 of the second embodiment may be made after execution of step 5 of the first embodiment shown in FIG. 1. That is, the heat treatment for rendering the crosslinked film 7 insoluble may be performed subsequently to the heat treatment (TFB) for causing reflow of the crosslinked film.

However, although the reflow step and the step of rendering the crosslinked film insoluble-can be separated from each other, there may occur a case that they are executed at the same time, depending on the setting of the heating temperature and time. The second embodiment includes both cases.

Although the above embodiments are directed to the case where a hyperfine separation resist pattern is formed on the semiconductor substrate 1, the invention is not limited to such a case. For example, a hyperfine separation film may be formed on an insulating layer such as a silicon oxide film or a conductive layer such as a polysilicon film, depending on the manufacturing process of a semiconductor device.

As exemplified above, the formation of a hyperfine separation resist patter according to the present invention has no limitation on the kind of underlying film, and can be applied to any base member as long as a resist pattern can be formed thereon; a hyperfine separation resist pattern can be formed on a base member that is suitable for a purpose. In this specification, such base members are genetically called a semiconductor base member.

According to the present invention, a semiconductor device is manufactured in such a manner that a hyperfine space or hole is formed in an underlying semiconductor base member such as a semiconductor substrate or any of various thin films by etching the semiconductor base member by using, as a mask, a hyperfine separation resist pattern formed in the above-described manner.

As described above, the method of manufacturing a semiconductor device according to the present invention makes it possible to form a hole pattern or a line pattern of a resist so that the hole diameter or the separation width becomes extremely small, to thereby provide a semiconductor device having a hyperfine pattern.

Further, since even very small residues that may occur in forming a hyperfine resist pattern can be removed, the manufacturing yield can be increased.

The entire disclosure of U.S. patent application Ser. No. 08/785,846 filed on Jan. 24, 1997, Ser. No. 09/049,072 filed on Mar. 27, 1998, Ser. No. 09/115,517 filed on Jul. 15, 1998, and Japanese Patent Publication No. 9-332583 including specifications, claims, drawings and summaries are incorporated herein by reference in their entirety.

Obviously many modifications and variations of the present invention are possible in the light of the above teachings. It is therefore to be understood that within the scope of the appended claims the invention may by practiced otherwise than as specifically described.

What is claimed is:

1. A method of manufacturing a semiconductor device comprising the steps of:
    forming, on a semiconductor base member, a first resist pattern of a first resist that is capable of generating acid;
    forming a film of a second resist on said first resist pattern, said second resist being such that a crosslinking reaction occurs therein under presence of acid;
    forming a crosslinked film in a portion of said film of the second resist that is in contact with said first resist pattern by causing said first resist pattern to supply acid to said film of the second resist;
    forming a second resist pattern in which said first resist pattern is covered with said crosslinked film by removing an uncrosslinked portion of said film of the second resist;
    performing a heat treatment to cause thermal reflow of said crosslinked film, to thereby reduce a gap in said second resist pattern; and
    etching said semiconductor base member by using, as a mask, said second resist pattern having the reflow-subjected crosslinked film.

2. The method of manufacturing a semiconductor device according to claim 1, further comprising, between the heat treatment performing step and the etching step, a step of cleaning said second resist pattern with pure water or a mixed solvent of pure water and an organic solvent to remove a residue in a portion that is not in contact with said first resist pattern.

3. The method of manufacturing a semiconductor device according to claim 1, wherein said heat treatment is performed in a temperature range of 120° through 126° C. and in a time range of 50 through 150 seconds.

4. The method of manufacturing a semiconductor device according to claim 1, wherein said heat treatment is performed in a temperature range of 123° through 125° C. and in a time range of 50 through 100 seconds.

5. The method of manufacturing a semiconductor device according to claim 1, wherein the gap of said second resist pattern is reduced to 0.1 µm or less by performing the heat treatment.

6. The method of manufacturing a semiconductor device according to claim 1, wherein said first resist has, as a main component, a mixture of a novolac resin and a napthoquinonediazide photosensitive agent.

7. The method of manufacturing a semiconductor device according to claim 1, wherein said first resist is a chemical amplification resist having a mechanism of generating acid.

8. The method of manufacturing a semiconductor device according to claim 1, wherein said second resist is a fine pattern forming material that has, as a main component, one selected from the group consisting of water soluble resin, a mixture of two or more kinds of water-soluble resins, and a copolymer of two or more kinds of water-soluble resins, and in which a crosslinking reaction occurs under presence of acid.

9. The method of manufacturing a semiconductor device according to claim 1, wherein said second resist is a fine pattern forming material that has, as a main component, one selected from the group consisting of crosslinking agent and a mixture of two or more kinds of crosslinking agents, and in which a crosslinking reaction occurs under presence of acid.

10. A method of manufacturing a semiconductor device comprising the steps of:
    forming, on a semiconductor base member, a first resist pattern of a first resist that is capable of generating acid;
    forming a film of a second resist on said first resist pattern, said second resist being such that a crosslinking reaction occurs therein under presence of acid;
    forming a crosslinked film in a portion of said film of the second resist that is in contact with said first resist pattern by causing said first resist pattern to supply acid to said film of the second resist;
    forming a second resist pattern in which said first resist pattern is covered with said crosslinked film by removing an uncrosslinked portion of said film of the second resist;
    performing a heat treatment to render said crosslinked film insoluble in pure water or a mixed solvent of pure water and an organic solvent;
    cleaning said second resist pattern with pure water or the mixed solvent of pure water and the organic solvent, to thereby remove a residue in a portion that is not in contact with said first resist pattern; and
    etching said semiconductor base member by using the residue-removed second resist pattern as a mask.

11. The method of manufacturing a semiconductor device according to claim 10, wherein said heat treatment is performed in a temperature range of 115° through 140° C. and in a time range of 50 through 150 seconds.

12. The method of manufacturing a semiconductor device according to claim 11, wherein said first resist has, as a main component, a mixture of a novolac resin and a naphthoquinonediazide photosensitive agent.

13. The method of manufacturing a semiconductor device according to claim 11, wherein said first resist is a chemical amplification resist having a mechanism of generating acid.

14. The method of manufacturing a semiconductor device according to claim 11, wherein said second resist is a fine pattern forming material that has, as a main component, one selected from the group consisting of water soluble resin, a mixture of two or more kinds of water-soluble resins, and a copolymer of two or more kinds of water-soluble resins, and in which a crosslinking reaction occurs under presence of acid.

15. The method of manufacturing a semiconductor device according to claim 11, wherein said second resist is a fine pattern forming material that has, as a main component, one selected from the group consisting of crosslinking agent and a mixture of two or more kinds of crosslinking agents, and in which a crosslinking reaction occurs under presence of acid.

16. A method of forming a resist pattern comprising the steps of:
    forming on a base member a first resist pattern of a first resist that is capable of generating an acid;
    forming a film of a second resist on said first resist pattern, said second resist being such that a crosslinking reaction occurs therein under presence of the acid;
    forming a crosslinked film in a portion of said film of the second resist that is in contact with said first resist pattern by causing said first resist pattern to supply acid to said film of the second resist;

forming a second resist pattern in which said first resist pattern is covered with said crosslinked film by removing an uncrosslinked portion of said film of the second resist;

performing a heat treatment to cause thermal reflow of said crosslinked film, to thereby reduce a gap in said second resist pattern.

17. A method of forming a resist pattern comprising the steps of:

forming on a base member a first resist pattern of a first resist that is capable of generating an acid;

forming a film of a second resist on said first resist pattern, said second resist being such that a crosslinking reaction occurs therein under presence of the acid;

forming a crosslinked film in a portion of said film of the second resist that is in contact with said first resist pattern by causing said first resist pattern to supply acid to said film of the second resist;

forming a second resist pattern in which said first resist pattern is covered with said crosslinked film by removing an uncrosslinked portion of said film of the second resist;

performing a heat treatment to render said crosslinked film insoluble in pure water or a mixed solvent of pure water and an organic solvent;

cleaning said second resist pattern with pure water or the mixed solvent of pure water and the organic solvent, to thereby remove a residue in a portion that is not in contact with said first resist pattern.

* * * * *